(12) United States Patent
Konishi

(10) Patent No.: US 8,395,238 B2
(45) Date of Patent: Mar. 12, 2013

(54) METHOD OF MANUFACTURING SEMICONDUCTOR DEVICE, AND SEMICONDUCTOR DEVICE

(75) Inventor: Kouichi Konishi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/929,664

(22) Filed: Feb. 7, 2011

(65) Prior Publication Data

US 2011/0127677 A1 Jun. 2, 2011

Related U.S. Application Data

(62) Division of application No. 12/320,101, filed on Jan. 16, 2009.

(30) Foreign Application Priority Data

Feb. 15, 2008 (JP) .................................. 2008-034228

(51) Int. Cl.
*H01L 21/00* (2006.01)
(52) U.S. Cl. ................. 257/573; 257/E33.006; 438/736
(58) Field of Classification Search .................. 438/736; 257/573, E33.006
See application file for complete search history.

(56) References Cited

U.S. PATENT DOCUMENTS

| | | | | |
|---|---|---|---|---|
| 4,557,797 A * | 12/1985 | Fuller et al. | ................... | 438/514 |
| 5,229,230 A * | 7/1993 | Kamon | ............................. | 430/5 |
| 5,483,741 A * | 1/1996 | Akram et al. | ................... | 29/846 |
| 5,728,504 A * | 3/1998 | Hosoda et al. | ................ | 430/192 |
| 5,770,350 A * | 6/1998 | Lee | ................ | 430/325 |
| 6,077,633 A * | 6/2000 | Lin et al. | ............................ | 430/5 |
| 6,250,606 B1 * | 6/2001 | Juso et al. | ..................... | 257/698 |
| 6,303,992 B1 * | 10/2001 | Van Pham et al. | ............ | 257/734 |
| 6,424,027 B1 * | 7/2002 | Lamson et al. | ................ | 257/676 |
| 6,767,682 B1 * | 7/2004 | Schroeder | ..................... | 430/312 |
| 7,598,005 B2 | 10/2009 | Yamamotot | | |
| 7,741,716 B1 * | 6/2010 | Venkitachalam et al. | .... | 257/758 |
| 2001/0036715 A1 | 11/2001 | Schroeder | | |
| 2006/0001174 A1 | 1/2006 | Matsui | | |
| 2009/0029294 A1 | 1/2009 | Gonda | | |
| 2009/0294977 A1 * | 12/2009 | Jao | ................ | 257/773 |
| 2010/0009298 A1 | 1/2010 | Chen et al. | | |

FOREIGN PATENT DOCUMENTS

| | | |
|---|---|---|
| JP | 8-008233 A | 1/1996 |
| JP | 2000-058644 A | 2/2000 |
| JP | 2001-343757 A | 12/2001 |
| JP | 2004-134574 | 4/2004 |

* cited by examiner

Primary Examiner — Jarrett Stark
Assistant Examiner — Nicholas Tobergte
(74) Attorney, Agent, or Firm — McGinn IP Law Group, PLLC

(57) ABSTRACT

A semiconductor device including a substrate, and an insulating film formed over the substrate, wherein the insulating film has a first contact having a rectangular geometry in a plan view, and second to fifth contacts provided respectively adjacent to the individual edges of the rectangular first contact, formed therein.

11 Claims, 12 Drawing Sheets

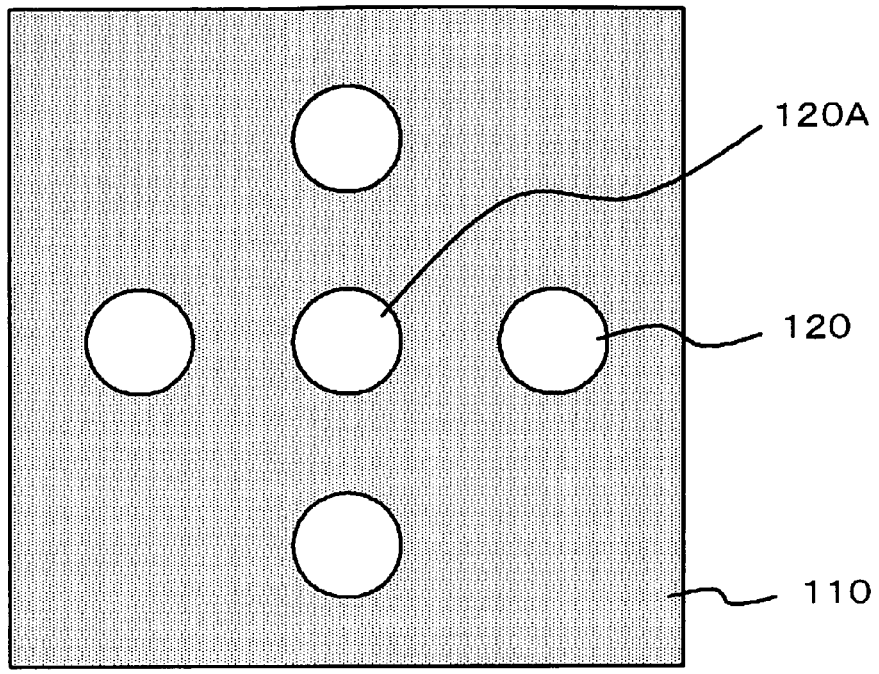
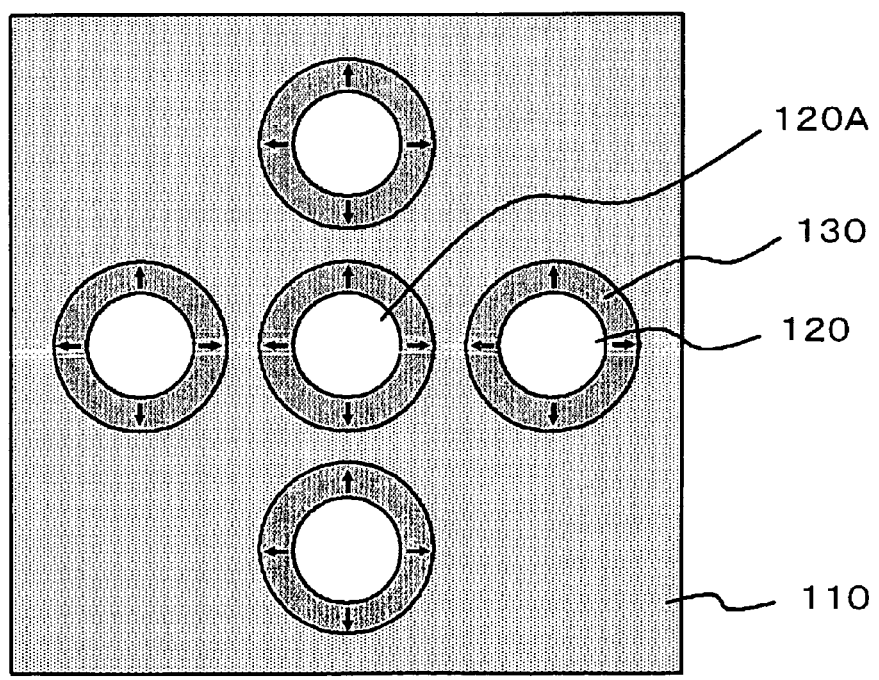

RELATED ART

METHOD OF MANUFACTURING SEMICONDUCTOR DEVICE, AND SEMICONDUCTOR DEVICE

The present Application is a Divisional Application of U.S. patent application Ser. No. 12/320,101, filed on Jan. 16, 2009, which is based on Japanese patent application No. 2008-034228, filed on Feb. 15, 2008, the entire contents of which is incorporated herein by reference.

BACKGROUND

1. Technical Field

The present invention relates to a method of manufacturing a semiconductor device, and a semiconductor device thus manufactured.

2. Related Art

In the recent field of semiconductor devices, shrinkage in patterning of interconnect trenches, contact holes and so forth has been advancing. Conventionally, the contact holes have been formed into a circular geometry in a plan view, due to resolution power of resist and other problems. Accordingly, also the contacts formed by filling up the contact holes with an electro-conductive material inevitably have a circular geometry in a plan view. However, when the pattern is shrunk, and the contacts having the circular geometry are extremely shrunk in the diameter thereof, the contact resistance between the contacts and interconnects may sometimes exceed a desired value.

Japanese Laid-Open Patent Publication No. 2004-134574 describes a method of manufacturing a semiconductor device, capable of forming a rectangular contact hole without increasing the number of masks nor procedures. An insulating interlayer herein is etched through a resist mask with a specially-selected gas, so as to allow fluorocarbons to deposit more readily on portions of the resist mask having larger inter-pattern distance. On the other hand, the fluorocarbons are less likely to deposit on portions of the resist mask having smaller inter-pattern distance, because only a few flat portions may be available there for the deposition of fluorocarbons.

Accordingly the recession of the pattern edge towards the region having the larger inter-pattern distances may be prevented while etching of the resist mask in the portion having the smaller inter-pattern distances proceeds. Therefore, by etching the insulating interlayer through thus-formed mask, the contact holes formed in the insulating interlayer may be shaped into a rectangular geometry.

SUMMARY

According to the present invention, there is provided a method of manufacturing a semiconductor device which includes:

forming a resist film over a film-to-be-etched formed over a substrate;

forming a first opening having a circular geometry in a plan view, and second to fifth openings arranged respectively on four sides of the first opening, in the resist film; and etching the film-to-be-etched while using the resist film as a mask, wherein in the process of etching the film-to-be-etched, a hardened layer is formed in a region of the resist film fallen between the first opening and each of the second to fifth openings, and the film-to-be-etched is etched while using the hardened layers as a mask, so as to form a contact hole having a rectangular geometry in a plan view in the film-to-be-etched at a position correspondent to the first opening of the resist film.

According to the above-described method of the present invention, the portions fallen between the adjacent openings (contact holes) will have the hardened layers formed therein. Since the hardened layers are extremely hard, so that they are unlikely to be etched in the process of etching the film-to-be-etched. Therefore, two adjacent contact holes are unlikely to couple in the film-to-be-etched. Because the contact holes may be prevented from being coupled, even if the distance between the adjacent opening are narrowed, a considerably fine design rule may be adoptable.

According to the present invention, there is provided also a semiconductor device which includes:

a substrate; and an insulating film formed over the substrate, wherein the insulating film has a first contact having a rectangular geometry in a plan view, and second to fifth contacts provided respectively adjacent to the individual edges of the rectangular first contact, formed therein.

According to the method described in Japanese Laid-Open Patent Publication No. 2004-134574, the contact holes finally formed are arranged according to a staggered layout. The contact holes are, however, generally arranged along orthogonal grid lines. Therefore, the contact holes arranged according to the staggered layout cannot be arranged along the grid lines. For this reason, the distance between the contact holes becomes larger than that between the grid lines, and a fine layout pattern cannot be achieved. In contrast, according to the configuration of a semiconductor device of the present invention, the contact holes may be arranged along 'the grind lines, so that a fine layout pattern may be achieved.

It is to be understood that any arbitrary combinations of the above-described constituents, and also any exchanges of the expression of the present invention among the method, device and so forth may be effective as embodiments of the present invention.

According to the present invention, a contact having a rectangular geometry in a plan view may be formed only by simple procedures.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 7A to 9 are plan views explaining a mechanism of formation of a contact having a rectangular geometry in a plan view, in one embodiment of the present invention;

DETAILED DESCRIPTION

Before describing the present invention, the related art will be explained in detail with reference to FIGS. 10A to 10C and FIGS. 11A to 12 in order to facilitate the understanding of the present invention.

Figure 10A:
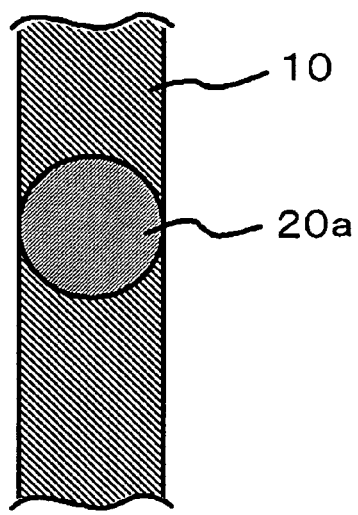
FIGS. 10A to 10C are plan views explaining a problem in a contact having a circular geometry in a plan view.
Figure 10B:
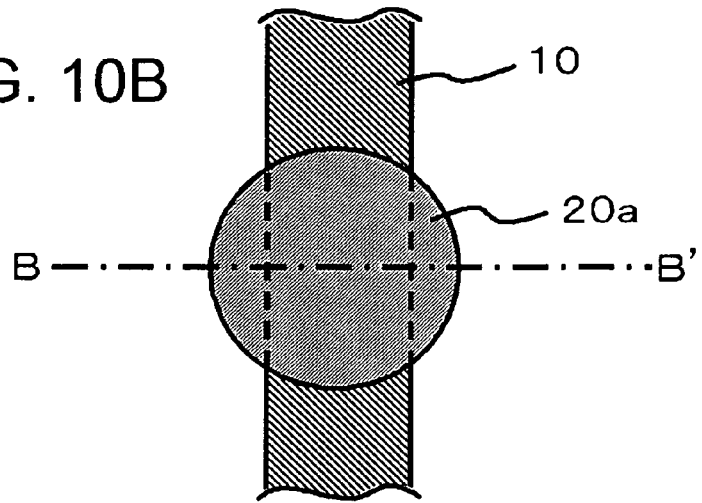
Figure 10C:
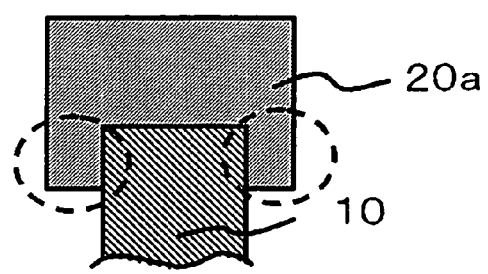

The present inventor has recognized that the contact resistance between the contacts and inter connects may sometimes exceed a desired value when the contacts with a circular geometry shrinks. The reason for this is explained by the present inventor as the followings:

As shown in FIG. 10A, a contact 20a having a circular geometry in a plan view may provide only a small contact area with an interconnect, and thereby the contact resistance may elevate. On the other hand, as shown in FIG. 10B, the contact 20a formed over a larger area may increase the contact area with the interconnect 10. An attempt of increasing the diameter of contact beyond the width of interconnect, however, raises another need of setting the diameter of the contact hole larger than the width of the interconnect 10, in the process of forming a contact hole for forming the contact 20a fallen on the interconnect 10. An insulating film (not illustrated) around the interconnect 10 may sometimes be etched to a depth deeper than the top surface of the interconnect. As a consequence, as shown in FIG. 10C, the interconnect 10 will be brought into contact with the contact 20a not only on the top surface thereof, but also on the side faces. FIG. 10C shows a sectional view taken along line B-B' in FIG. 10B. Once this sort of geometry is achieved, a void may be produced in the process of filling up the contact hole with an electro-conductive material to form the contact, and may elevate the contact resistance between the contact 20a and the interconnect 10.

Figure 11A:
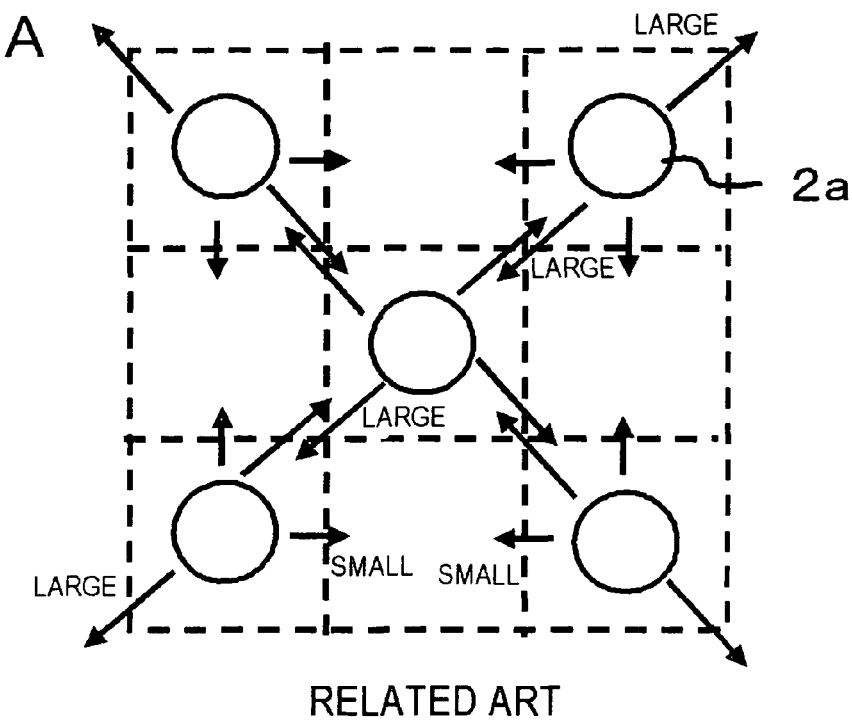
FIGS. 11A and 11B are plan views explaining the related art of formation of a contact having a rectangular geometry in a plan view.
Figure 11B:
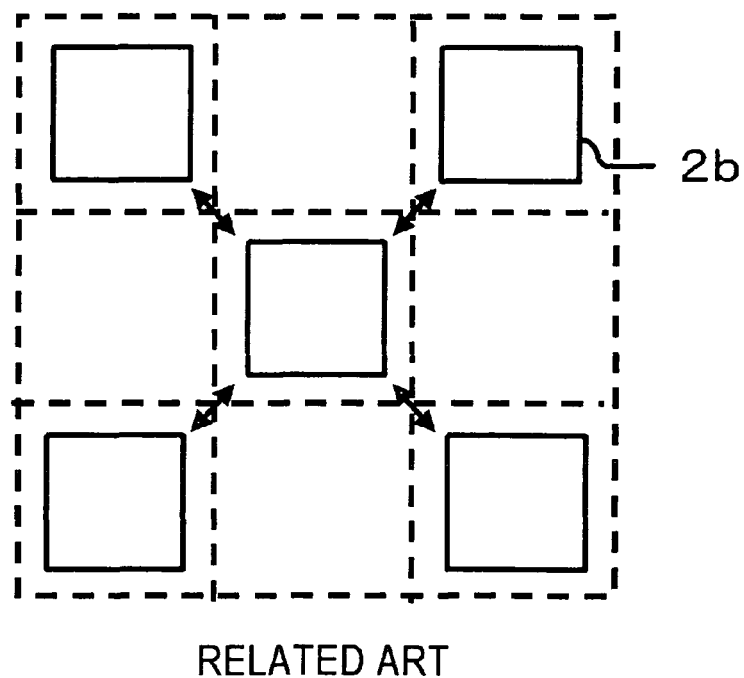

The present inventor has also recognized that the method described in Japanese Laid-Open Patent Publication No. 2004-134574 may cause an unintended connection between the adjacent contacts. The reason for this is explained by the present inventor as the followings:

FIGS. 11A and 11B are schematic drawings for explaining the technique described in Japanese Laid-Open Patent Publication No. 2004-134574.

First, as shown in FIG. 11A, a plurality of circular contact hole patterns 2a are formed in a resist mask. Plasma etching is then proceeded according to process conditions under which fluorocarbons may be more likely to deposit on the portions of the resist mask having larger inter-pattern distances. In this process, the portion of the resist mask having larger inter-pattern distances (the portions between the horizontally-adjacent, and vertically-adjacent patterns in the drawing) may keep some flat portions remained unetched on which the fluorocarbons can deposit, even after the edge portions of the circular holes of the resist mask were lost by etching. Etching of the resist mask in the portions having the larger inter-pattern distances may, therefore, be suppressed with progress of the deposition of fluorocarbons. As a consequence, recession of the pattern edge in the direction towards the region having the larger inter-pattern distances may be prevented.

On the other hand, the portion of the resist mask having smaller inter-pattern distances (the portions between the obliquely-adjacent patterns in the drawing) may cause recession at the shoulder portions of the resist mask, and may keep only a few portions, on which the fluorocarbons can deposit, remained unetched. Etching of the resist mask then proceeds in the portion having the smaller inter-pattern distances. Indications of "LARGE" in the drawing herein means that the amount of etching is large, and indications of "SMALL" means that the amount of etching is small.

Accordingly, rectangular contact holes 2b as shown in FIG. 11B may be formed. By etching the insulating interlayer through thus-formed mask, the contact holes formed in the insulating interlayer may be shaped into a rectangular geometry.

Figure 12:
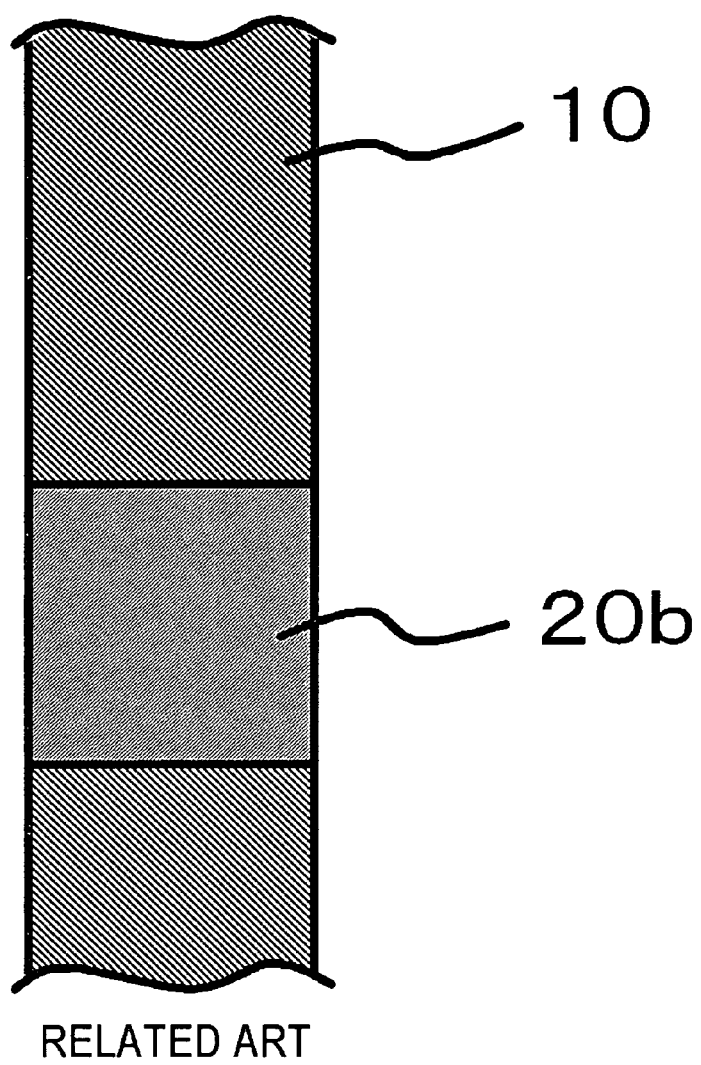
FIG. 12 is a plan view showing a contact having a circular geometry in a plan view.

If the contact holes may be formed into a rectangular geometry in a plan view as shown in FIG. 12, the contact area between each of a contacts 20b and the interconnect 10 may be wider than that in the case where each contact has a circular geometry. This configuration is supposed to suppress the contact resistance to a low level.

The technique described in Japanese Laid-Open Patent Publication No. 2004-134574 has, however, raised a problem in that the resist mask in the portions having smaller inter-pattern distances may be lost during the etching proceeds, so that the adjacent contact holes may be coupled, which causes the connection of the adjacent contacts later formed in the adjacent contact holes, unless otherwise the timing is precisely controlled.

According to the method described in Japanese Laid-Open Patent Publication No. 2004-134574, the distance between the obliquely-adjacent contact holes may gradually decrease as the etching proceeds as shown in FIG. 11B, and two adjacent contact holes may even be brought into contact with each other in the worst case. In this situation, leakage may undesirably occur, which is difficult to control.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiment of the present invention will be explained below, referring to the attached drawings. It is to be noted that any similar constituents in all drawings will be given with similar reference numerals, and that the explanation therefor will not be repeated depending on the context.

FIGS. 1A to 4B are sectional views sequentially showing steps of manufacturing a semiconductor device of this embodiment. FIGS. 5A to 6B are plan views sequentially showing steps of manufacturing a semiconductor device of this embodiment. FIGS. 1A to 4B are sectional views taken along lines A-A' in FIGS. 5A to 6B. In the embodiment below, an explanation will be made on an exemplary case of patterning the film-to-be-etched using a multilayer (four-layered) resist structure having a lower resist film, an intermediate insulating film, an anti-reflective film, and an upper resist film stacked in this order from the bottom.

First, on a structure containing a semiconductor substrate 102 (substrate) and an insulating film 104 formed over it, an etching stopper 106 and an insulating interlayer 108 are formed. The semiconductor substrate 102 may be a silicon substrate, for example. Although not illustrated, the semiconductor substrate 102 may have transistor(s) or other element(s) formed thereon. Again not illustrated, the insulating film 104 may have interconnect(s) preliminarily formed therein, at positions where contacts formed later in the insulating interlayer 108 are connected thereto. The etching stopper 106 may be a SiON film or a SiN film, for example.

In this embodiment, the insulating interlayer 108 is a target film to be etched in which the contact holes are formed. The insulating interlayer 108 may typically be composed of a $SiO_2$ film, or a low-k film having a specific dielectric constant smaller than that of $SiO_2$ film. The embodiments hereinafter will deal with the cases where the insulating interlayer 108 is composed of a $SiO_2$ film. In the embodiments below, the contact holes may be those connecting interconnect layers with impurity-diffused layers or with gate electrodes, or may be viaholes connecting two interconnect layers.

Next, a lower resist film 110 is formed over the insulating interlayer 108. The lower resist film 110 may be composed of any of novolac resins, acryl resins, copolymers of these resins such as i-line resist, or polyhydroxystyrene such as KrF resist. In this embodiment, the lower resist film 110 may be formed by coating a resist composed of any of these materials, followed by baking.

Next, an intermediate insulating film 112 is formed over the lower resist film 110. The intermediate insulating film 112 may typically be composed of any of silicon-containing films such as organic silicon oxide film. The intermediate insulating film 112 may also be configured by stacking a plurality of films composed of silicon-containing materials.

Thereafter, an anti-reflective film 114 is formed over the intermediate insulating film 112. The anti-reflective film 114 may typically be composed of an organic film.

Next, an upper resist film 116 is formed over the anti-reflective film 114. For example, a resist generally used for ArF immersion lithography may be adoptable to the upper resist film 116. The upper resist film 116 may be formed by coating of resin composition, or by CVD.

Figure 1A:
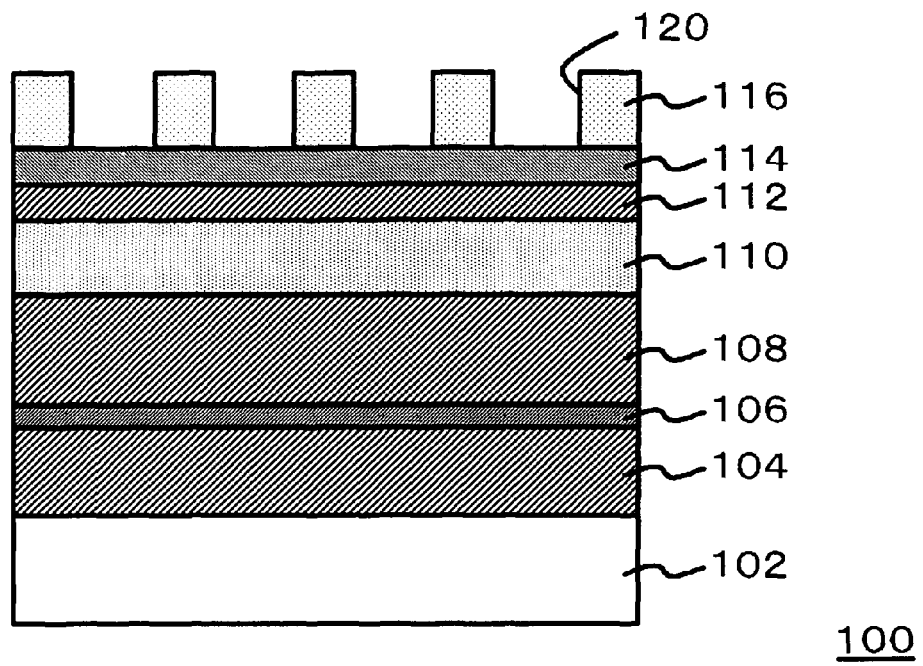
FIGS. 1A to 4B are sectional views sequentially showing steps of manufacturing a semiconductor device of one embodiment of the present invention.

Thereafter, a predetermined resist pattern is formed in the upper resist film 116 by a lithographic method including ArF immersion lithography and development. The predetermined resist pattern herein has a plurality of contact hole patterns 120 (openings) respectively having a circular geometry in a plan view. FIG. 1A shows this state.

Figure 5A:
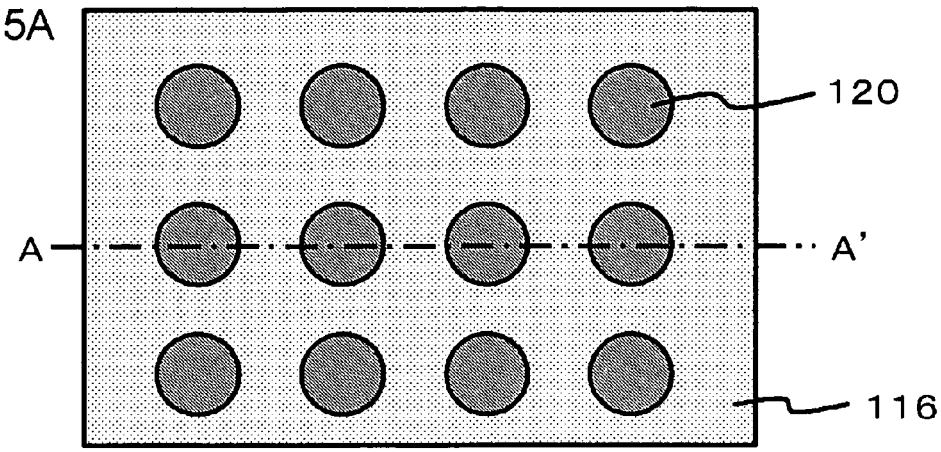
FIGS. 5A to 6B are plan views sequentially showing steps of manufacturing a semiconductor device of one embodiment of the present invention.

FIG. 5A is a plan view showing a semiconductor device 100 in this state. As shown in FIG. 5A, a plurality of contact hole patterns 120 respectively having a circular geometry are arranged to form a matrix. In particular, the contact hole patterns 120, correspondent to the contact holes desired to be formed into a rectangular geometry, may be arranged while being surrounded on four sides thereof by other contact hole patterns 120. The distance between the adjacent contact hole patterns 120 (distance between the outer circumferences of the adjacent contact holes) may preferably be adjusted to 100% or larger and up to 115% of the diameter of the contact hole patterns 120, and particularly preferably adjusted to 100% (that is, the distance equal to the diameter of the contact hole patterns 120).

Next, the lower layers are sequentially etched by dry etching, using the pattern formed in the upper resist film 116. The dry etching adoptable herein may be proceeded using an etching apparatus based on any of plasma excitation systems including capacitively-coupled plasma (CCP), inductively-coupled plasma (ICP) and so forth.

Figure 1B:
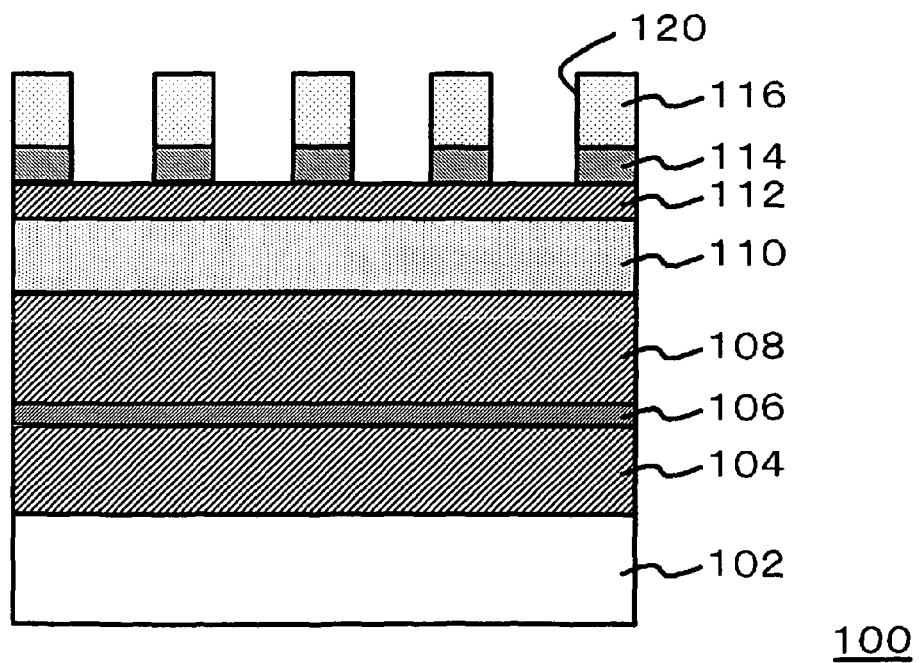

First, using the upper resist film 116 as a mask, the anti-reflective film 114 is etched (FIG. 1B). In this process, a fluorocarbon gas may be used as an etching gas. Perfluorocarbon (PFC) such as $CF_4$ may be used as the fluorocarbon gas. The etching process herein may be similar to that generally adopted to etching of the anti-reflective film through the multilayer resist film. Exemplary conditions include pressure of etching gas=100 mT, power (TOP/BTM)=1500/450 W, gas flow rate $CF_4$=400 sccm, and duration=25 seconds. The etching herein is proceeded under two different electric powers at two different frequencies, where "TOP" and "BTM" indicate electric powers at a higher frequency and a lower frequency, respectively.

Figure 2A:
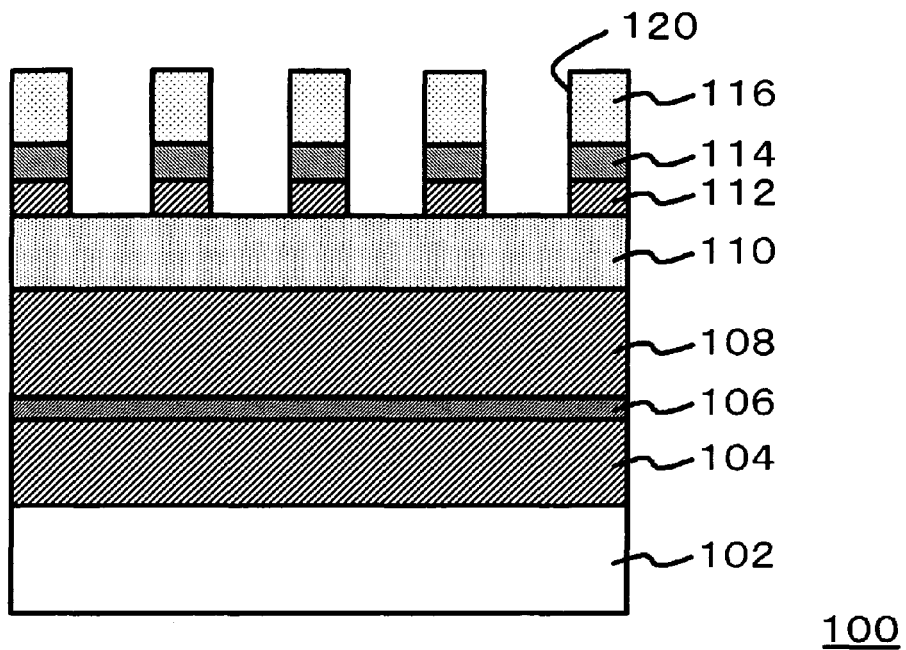

Next, the intermediate insulating film 112 is etched using the upper resist film 116 and the anti-reflective film 114 as a mask (FIG. 2A). In this process, for example, a mixed gas of a fluorocarbon gas with an inert gas such as Ar may be used as the etching gas. As the fluorocarbon gas, a perfluorocarbon (PFC) such as $CF_4$ may be adoptable. More specifically, a $CF_4$/Ar mixed gas, for example, may be adoptable to the etching gas. The etching process herein may be similar to that generally adopted to etching of the intermediate insulating film through the multilayer resist film. Exemplary conditions include pressure of etching gas=30 mT, power (TOP/BTM)=1500/300 W, gas flow rate $CF_4$/Ar=70/1000 sccm, and duration=20 seconds. Alternatively, the anti-reflective film 114 and the intermediate insulating film 112 may be etched using the same gas at the same time.

Figure 2B:
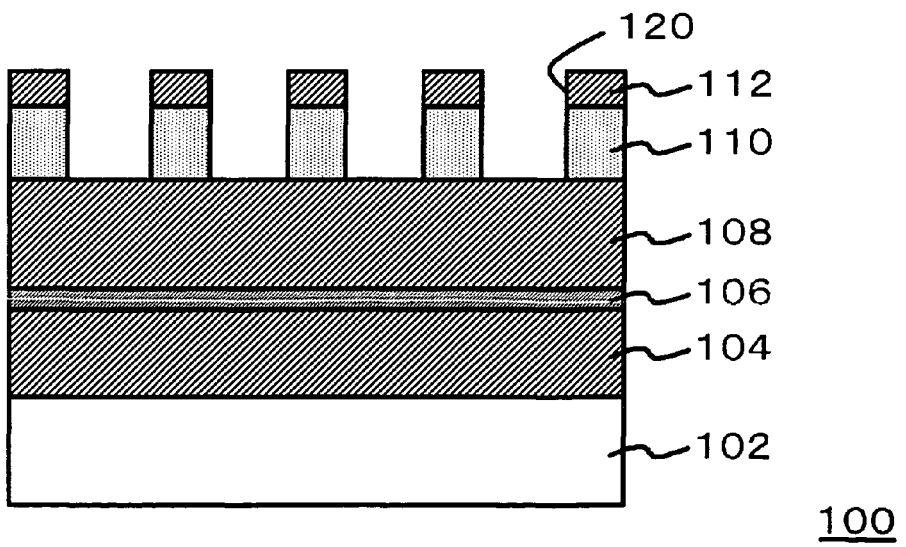

Thereafter, the lower resist film 110 is etched using the upper resist film 116, the anti-reflective film 114 and the intermediate insulating film 112 as a mask, (FIG. 2B). In this process, for example, a gas containing an oxidative gas such as oxygen may be adoptable to the etching gas. More specifically, an $O_2$/$N_2$ mixed gas may typically be used as the etching gas. Exemplary conditions include pressure of etching gas=10 mT, power (TOP/BTM)=1800/300 W, gas flow rate $O_2$/$N_2$=30/250 sccm and duration=60 seconds. In this process, also the upper resist film 116 and the anti-reflective film 114 are etched off. Although the lower resist film 110 in this embodiment is preliminarily baked, the lower resist film 110 may desirably be patterned by using a gas containing an oxidative gas, such as an $O_2$/$N_2$ mixed gas, as the etching gas.

Next, the insulating interlayer 108 is etched using the intermediate insulating film 112 and the lower resist film 110 as a mask. As the etching gas in this process, a mixed gas of a fluorocarbon gas with an inert gas such as Ar, and with an oxidative gas such as oxygen, carbon monoxide and so forth, may be adoptable. As the fluorocarbon gas, those having a plurality of carbon atoms in one molecule, such as $C_2F_4$, $C_2F_6$, $C_4F_8$, $C_5F_8$, $C_4F_6$ and so forth, may be adoptable. Among these, $C_5F_8$ and $C_4F_6$ are preferably used. This is because they may show large etchrate of silicon oxide film, and may keep large selectivity against the etching stopper 106 composed of SiON, SiN or the like. More specifically, a $C_5F_8$/Ar/CO/$O_2$ mixed gas or a $C_4F_6$/Ar/$O_2$ mixed gas may be used as the etching gas.

Figure 5B:
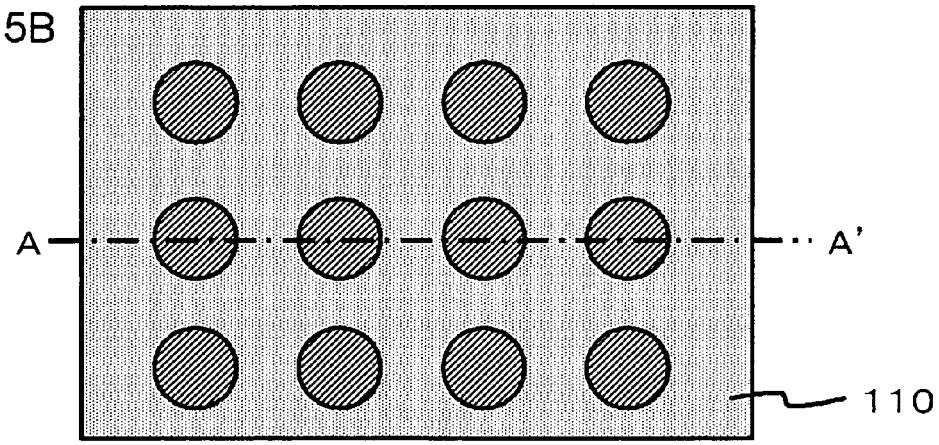

When etching of the insulating interlayer 108 is started using the above-described etching gas, while using the intermediate insulating film 112 and the lower resist film 110 as a mask, first the intermediate insulating film 112 is etched off, and thereby the lower resist film 110 exposed to the top surface. FIG. 5B is a plan view showing this state. In this process, as has been explained referring to FIG. 5A, a plurality of contact hole patterns 120 (first to fifth openings) each having a circular geometry, replicated from the contact hole patterns 120 formed in the upper resist film 116, are formed in the lower resist film 110.

Figure 3A:
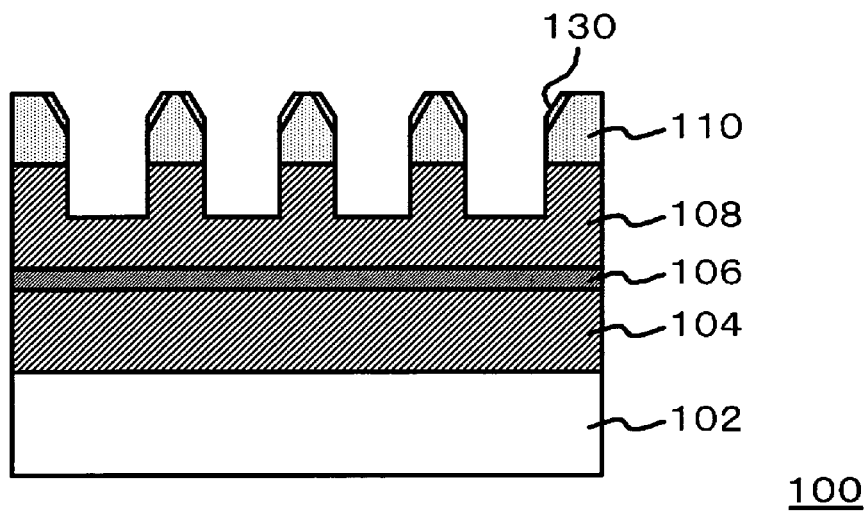
Figure 5C:
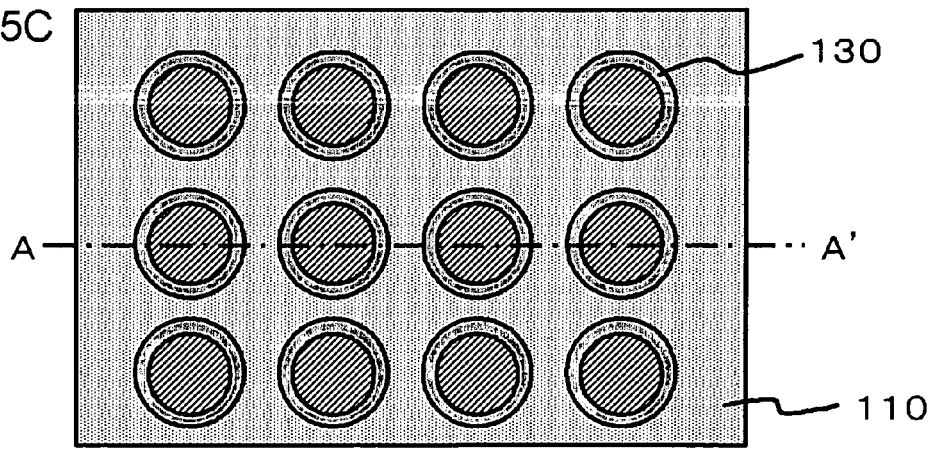

If the etching gas is further irradiated in this situation, the lower resist film 110 is gradually etched at the portions corresponding to the shoulders of the contact hole patterns 120 as shown in FIG. 3A, the lower resist film 110 begins to harden, and thereby semi-hardened layers 130 are formed around the contact hole patterns 120. FIG. 5C is a plan view showing this state.

Figure 3B:
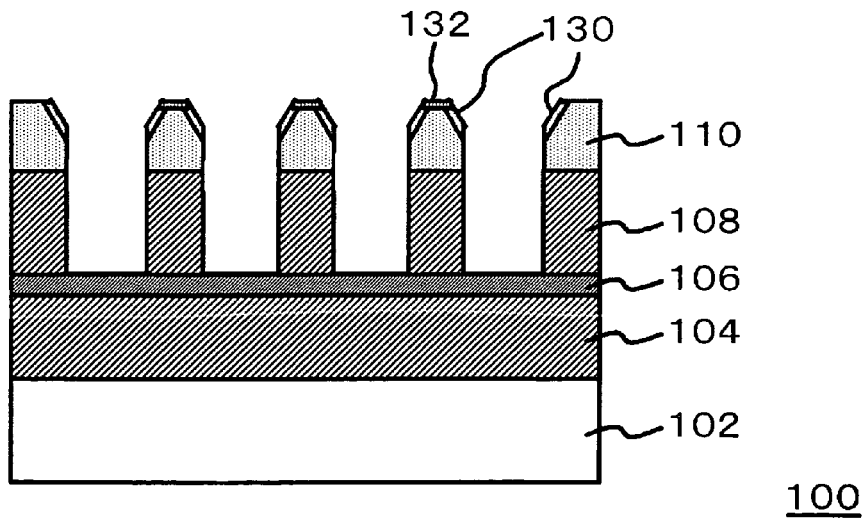
Figure 6A:
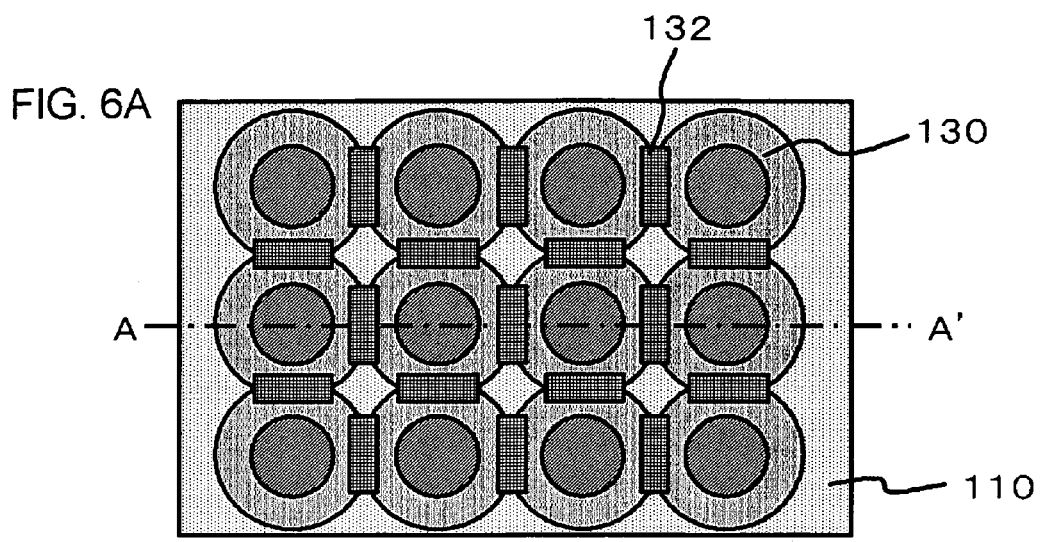

If the etching gas is still further irradiated, the semi-hardened layers 130 gradually extend towards the periphery of the contact hole patterns 120. In the regions where the semi-hardened layers 130 formed around two adjacent contact hole patterns 120 overlap each other, there are formed hardened layers 132 extremely large in the hardness (FIG. 3B, FIG. 6A).

Figure 4A:
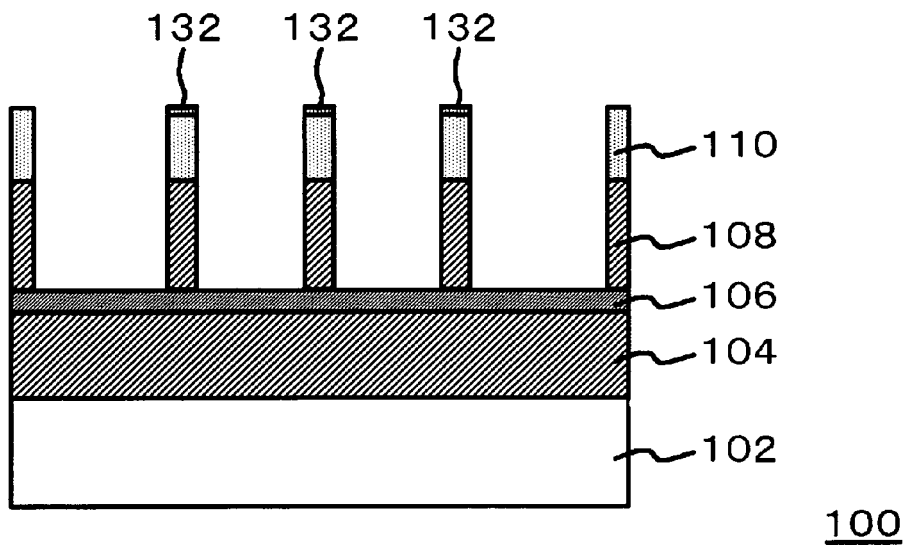

If the irradiation of the etching gas is still further continued, the hardened layers 132 serve as a mask, so that the lower resist film 110 and the insulating interlayer 108 are no more etched below the hardened layers 132. On the other hand, in any other portions having no hardened layers 132 formed thereon, etching of the lower resist film 110 and the insulating interlayer 108 proceed (FIG. 4A).

Figure 6B:
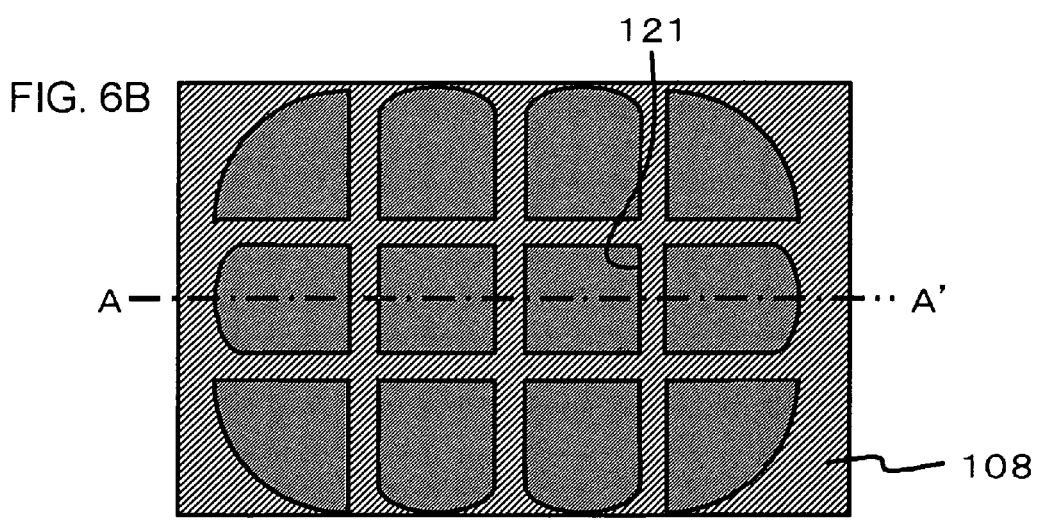

As a consequence, as shown in FIG. 6B, the contact hole 121 surrounded by other contact hole 121 on four sides thereof has a rectangular geometry in a plan view.

Figure 4B:
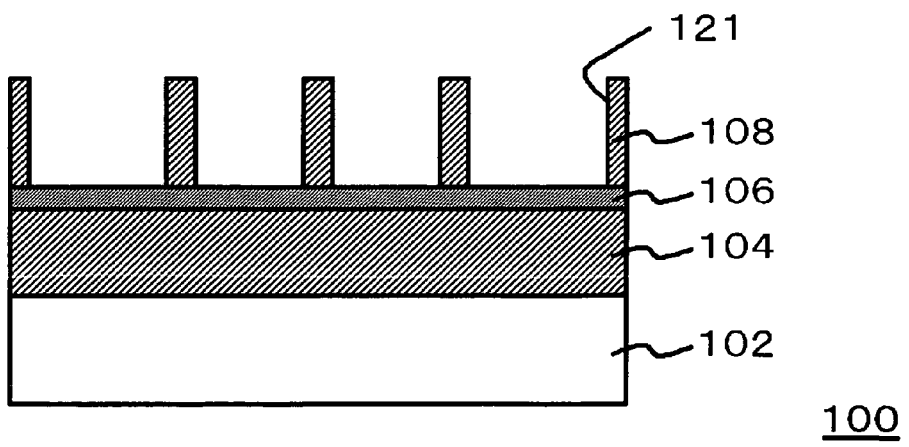

Thereafter, the product is irradiated with an oxygen plasma, and the hardened layer 132 and the lower resist film 110 are removed by ashing (FIG. 4B, FIG. 6B).

In this embodiment, the irradiation of etching gas for removing the insulating interlayer 108, when using the lower resist film 110 as a mask, is sustained for a longer duration than usual. In this way, the lower resist film 110 and the insulating interlayer 108 are etched also in the regions other than those initially exposed in the contact hole pattern 120 formed in the lower resist film 110, and the hardened layers 132 are formed at the same time. The duration of irradiation of etching gas is set depending on the thickness of the insulating interlayer 108 to be removed but may be set typically to 240 seconds or longer.

Exemplary conditions may include pressure of etching gas=30 mT, power (TOP/BTM)=2400/2700 W, $C_5F_8$/Ar/CO/$O_2$=20/950/40/22 sccm, and duration=250 seconds. Alternative exemplary conditions may include pressure of etching gas=30 mT, power (TOP/BTM)=1500/3000 W, $C_4F_6$/Ar/$O_2$=23/1000/22 sccm, and duration=280 seconds. By using predetermined gases and by irradiating the etching gases for long durations as described in the above, the hardened layers 132 may be formed in the lower resist film 110, and thereby the contact holes 121 having a rectangular geometry in a plan view may be formed.

Thereafter, the etching stopper 106 is etched while using the insulating interlayer 108 as a mask. Processes thereafter may be proceeded similarly to the general etching.

Next, a mechanism of formation of the contact hole patterns 120 having a rectangular geometry in this embodiment will be explained referring to FIGS. 7A to 9.

FIG. 7A is a plan view showing a state of formation of a plurality of contact hole patterns 120 in the lower resist film 110. For the convenience of explanation, one contact hole pattern 120 provided at the center will be indicated as 120A. On four sides on the vertical and horizontal directions, in the drawing of the contact hole pattern 120A, other contact hole patterns 120 are formed. Through the lower resist film 110 having such opening patterns, the mixed gas containing the above-described fluorocarbon gas is irradiated. By this process, the portions of the insulating interlayer 108 (not illustrated herein), fallen under the contact hole patterns 120 of the lower resist film 110, are etched. At the same time, also the lower resist film 110 is gradually thinned from the shoulder portions of the contact hole patterns 120 laterally and vertically, and thereby the semi-hardened layers 130 are formed around the contact hole patterns 120 (FIG. 7B).

Figure 8A:
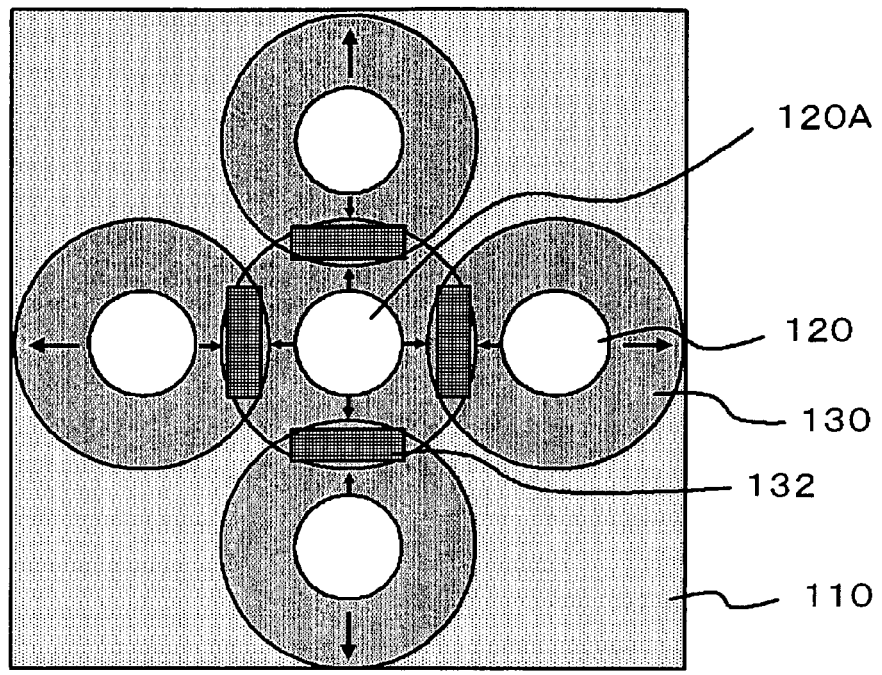

The semi-hardened layers 130 gradually extend around the periphery of the individual contact hole patterns 120. When the semi-hardened layers 130 respectively formed around two adjacent contact hole patterns 120 extend so far to overlap each other, the overlapped portions turn into the hardened layers 132 having an extremely large hardness (FIG. 8A). The hardened layers 132 are formed to have a rectangular geometry between every adjacent contact hole patterns 120.

The lower resist film 110 and the insulating interlayer 108 in this process are gradually thinned so as to gradually widen the contact hole patterns 120 formed in the lower resist film 110, wherein under the portions where the hardened layers 132 are already formed, the etching of the lower resist film 110 is inhibited. In other words, in the portions where the hardened layers 132 are formed, widening of the contact hole patterns 120 due to etching is inhibited.

Figure 8B:
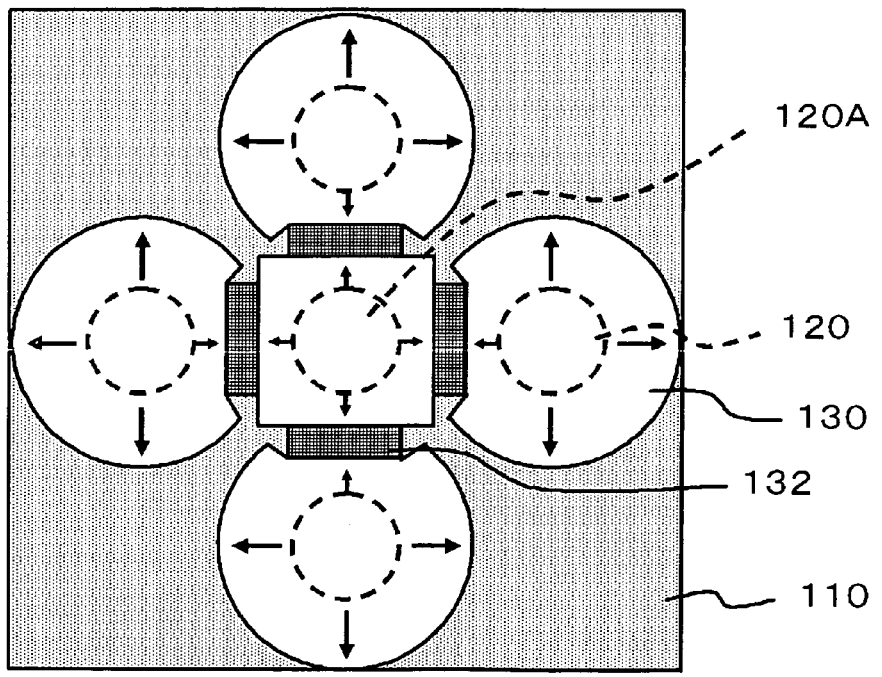
Figure 9:
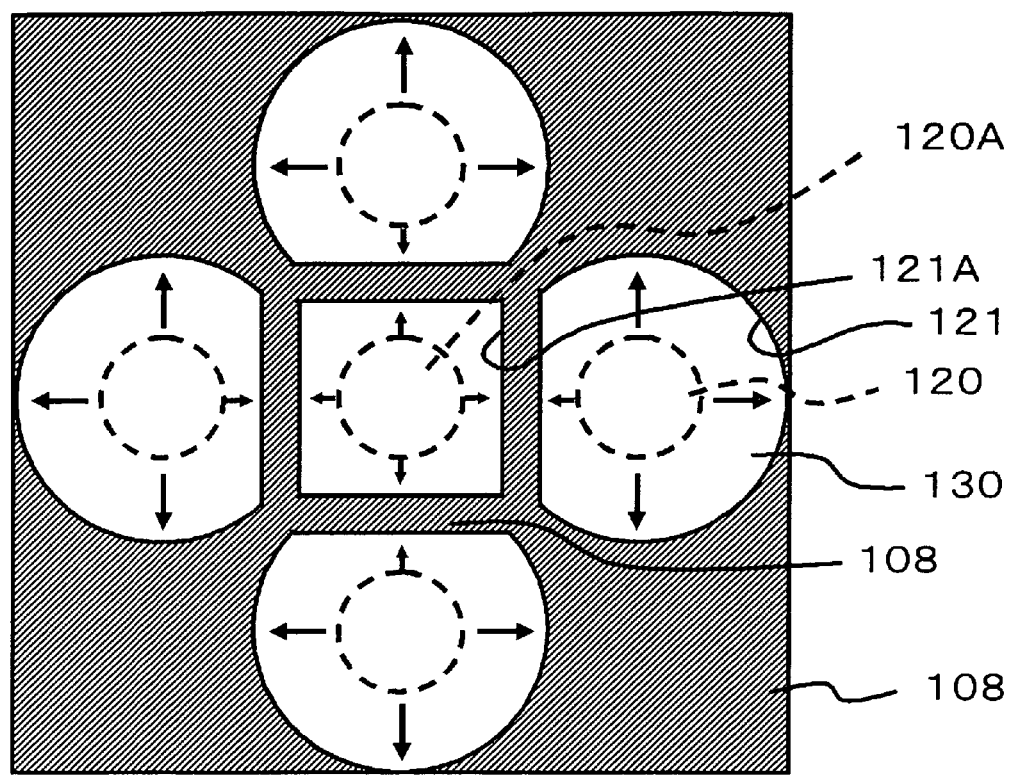

Accordingly, in the portions where the hardened layers 132 are formed, the geometry of the contact hole patterns 120 is specified in a manner replicated from the geometry of the hardened layers 132. The contact hole pattern 120A, surrounded on four sides thereof by the other contact hole patterns 120, will consequently be surrounded on four sides thereof by the hardened layers 132, and will finally have a rectangular geometry. On the other hand, in the portions having no hardened layers 132 formed therein, the lower resist film 110 are etched in the lateral and vertical directions, and gradually thinned. As a consequence, in the portions not adjacent to the other contact hole patterns 120, and have no hardened layers 132 formed therein, the geometry of the contact hole patterns 120 gradually swells (FIG. 8B). It is to be noted that the semi-hardened layers 130, actually formed around the contact hole patterns 120 as the geometry of the contact hole patterns 120 swells, are not illustrated herein. In the portions where the lower resist film 110 is thinned, also the insulating interlayer 108 masked by such lower resist film 110 is thinned. In this way, the contact holes 121 (121A) are formed in the insulating interlayer 108 (FIG. 9).

In this embodiment, the contact hole 121A formed in the portion correspondent to the contact hole pattern 120A has a rectangular geometry in a plan view. In addition, the other contact holes are formed in the portions adjacent to the individual edges of the rectangular contact hole 121A, that is, in the portions along the individual edges. Although FIG. 9 shows only a single contact hole 121A having a rectangular geometry, a plurality of contact holes 121 having a rectangular geometry may be formed by arranging a larger number of contact hole patterns 120 into a matrix, as shown in FIG. 6B.

Next, effects of the semiconductor device 100 and the method of manufacturing the same of this embodiment will be explained.

According to the procedures of manufacturing the semiconductor device 100 in this embodiment, the contact holes 121 having a rectangular geometry may be formed in the insulating interlayer 108, simply by forming the contact hole patterns 120 having a circular geometry similar to the conventional one in the lower resist film 110, and by controlling the conditions so that the hardened layers 132 may be formed between the adjacent contact hole patterns 120. In this way, the contacts having a rectangular geometry may be formed by simple procedures. By forming the contacts into a rectangular geometry, the contact area thereof with an interconnect formed on the lower or upper side thereof may be increased, and thereby the contact resistance may be lowered.

On the other hand, according to the method described in Japanese Laid-Open Patent Publication No. 2004-134574, the distance between the obliquely-adjacent contact holes may gradually decrease as the etching proceeds as shown in FIG. 11B, and two adjacent contact holes may be even brought into contact with each other in the worst case. In such situation, leakage may undesirably occur, which is difficult to control.

In contrast, according to the procedures for manufacturing the semiconductor device 100 of this embodiment, the hardened layers 132 are formed between the adjacent contact hole patterns 120, in the process of hardening of the lower resist film 110 at around the contact hole patterns 120. The hardened layers 132 have an extremely large hardness, and are therefore not thinned in the process of etching the insulating interlayer 108. Accordingly, there is no fear of coupling of two adjacent contact holes in the insulating interlayer 108. Since the coupling of the contact holes is thus avoidable even if the distance between the adjacent contacts is narrowed, so that a considerably fine design rule may be adoptable.

The hardened layers 132 described in the above may stably be formed, particularly in the lower resist film 110 of the multilayer resist structure containing the lower resist film 110, the intermediate insulating film 112, the upper resist film 116 and so forth. In thus-configured multilayer resist structure, a relatively soft film is adopted to the upper resist film 116, in view of forming fine patterns. On the other hand, as the lower resist film 110, a film harder than the upper resist film 116 is used. When this sort of film is used, the semi-hardened layers 130 are formed in the lower resist film 110 as the etching of the lower resist film 110 proceeds, and thereby the hardened layers 132 are formed. The dimension of the contact holes 121 formed in the insulating interlayer 108 may appropriately be adjustable, by adjusting, for example, the duration of etching of the lower resist film 110.

Moreover, according to the method described in Japanese Laid-Open Patent Publication No. 2004-134574, the resultant contact holes are arranged according to a staggered layout. In other words, when a certain contact hole is brought into focus, the other contact holes are formed in the oblique directions of the contact hole.

In contrast, according to the configuration of the semiconductor device 100 of this embodiment, the other contact holes are respectively formed in the regions adjacent to the individual edges of the rectangular contact hole 121A, that is, at the positions along the individual edges. Accordingly, for an exemplary case where it is desired to densely form the contacts along orthogonal grid lines, it is now possible to form the contact holes along the grid lines. Therefore, a fine structure may be realized, and the design therefor may be readily accessible.

EXAMPLES

Example 1

The contact holes were formed in the insulating interlayer 108, according to the procedures explained referring to FIGS. 1A to 6B.

Configurations of the individual films are as follow:
etching stopper 106: SiON film (50 nm thick);
insulating interlayer 108: $SiO_2$ film (750 nm thick);
lower resist film 110: i-line resist (350 nm thick);
intermediate insulating film 112: $SiO_2$ film (60 nm thick);
anti-reflective film 114: organic film (60 nm thick); and
upper resist film 116: resist for ArF immersion lithography (230 nm thick).

Etching conditions of the individual films were set as below:
anti-reflective film 114: pressure of etching gas=100 mT, power (TOP/BTM)=1500/450 W, gas flow rate $CF_4$=400 sccm, duration=25 seconds;
intermediate insulating film 112: pressure of etching gas=30 mT, power (TOP/BTM)=1500/300 W, gas flow rate $CF_4/Ar$=70/1000 sccm, duration=20 seconds;
lower resist film 110: pressure of etching gas=10 mT, power (TOP/BTM)=1800/300 W, gas flow rate $O_2/N_2$=30/250 sccm, duration=60 seconds;
insulating interlayer 108: pressure of etching gas=30 mT, power (TOP/BTM)=2400/2700 W, $C_5F_8/Ar/CO/O_2$=20/950/40/22 sccm, duration=250 seconds; and
etching stopper 106: pressure of etching gas=25 mT, power (TOP/BTM)=1500/600 W, $CHF_3/Ar/O_2$=50/400/20 sccm, duration=30 seconds.

It was finally confirmed that the contact hole, correspondent to the contact hole pattern 120 at a position surrounded by the other contact holes, had a rectangular geometry.

Example 2

The insulating interlayer 108 was etched similarly to as described in Example 1, except that the etching conditions were altered. Conditions for etching the insulating interlayer 108 included pressure of etching gas=30 mT, power (TOP/BTM)=1500/3000 W, $C_4F_6/Ar/O_2$=23/1000/22 sccm, and duration=280 seconds.

It was finally confirmed that the contact hole, correspondent to the contact hole pattern 120 at a position surrounded by the other contact holes, had a rectangular geometry.

The embodiments of the present invention have been described referring to the attached drawings, only as mere examples of the present invention, while allowing adoption of various configurations other than those described in the above.

The embodiments in the above showed exemplary cases where the hardened layers 132 are formed in the lower resist film 110, using a gas used for etching the insulating interlayer 108 which is a film-to-be-etched. On the other hand, for the case where the gas capable of forming the hardened layers 132 in the lower resist film 110 is incapable of etching the film-to-be-etched formed thereunder, the film-to-be-etched may be etched using a different gas after the hardened layer 132 are formed in the lower resist film 110 with such the lower resist film 110 used as a mask.

Still alternatively, in order to make the contact relevant to operations of the semiconductor device into a rectangular geometry, dummy contacts non-relevant to the operations of the semiconductor device may be arranged therearound. By providing the dummies, the target contact may be made into a rectangular geometry.

Although the geometry of the contact hole patterns 120 described in the embodiments above were circle, they may also be ellipse. Again, the geometry of the contact hole 121 having a rectangular geometry, exemplified as square, may also be oblong rectangle.

It is apparent that the present invention is not limited to the above embodiment, that may be modified and changed without departing from the scope and spirit of the invention.

What is claimed is:

1. A semiconductor device, comprising:
   a substrate; and
   an insulating film formed over said substrate, wherein said insulating film comprises:
      a first contact hole having a rectangular geometry in a plan view; and
      second to fifth contact holes provided respectively adjacent to the individual edges of said rectangular first contact hole, formed therein,
   wherein four sides of said first contact hole are substantially perpendicular to a surface of said substrate, and
   wherein said second to fifth contact holes surrounding said first contact hole comprise a circular shape.

2. The semiconductor device as claimed in claim 1, wherein said circular shape of said second to fifth contact holes surrounding said first contact hole comprises, at a portion adjacent to individual rectangular edges of the first contact hole, a rectangular edge.

3. A semiconductor device, comprising a resist film formed over a substrate, the resist film having defined therein a contact hole having a rectangular geometry in a plan view in said resist film surrounded by contact holes on four sides thereof, wherein four sides of said contact hole are substantially perpendicular to a surface of said substrate, and wherein said contact holes surrounding said rectangular contact hole comprise a circular shape.

4. The semiconductor device as claimed in claim 3, wherein said resist film comprises a lower resist film of a multilayer resist film comprising the lower resist film, an intermediate insulating film, and an upper resist film, formed in this order.

5. The semiconductor device as claimed in claim 4, wherein said multilayer resist film further comprises an anti-reflective film formed between said intermediate insulating film and said upper resist film.

6. The semiconductor device as claimed in claim 3, further comprising a plurality of contact holes having said rectangular geometry.

7. The semiconductor device as claimed in claim 6, further comprising a plurality of contact holes formed adjacent to individual edges of the rectangular contact holes.

8. The semiconductor device as claimed in claim 3, wherein said circular shape of said contact holes surrounding said rectangular contact hole comprises, at a portion adjacent to individual edges of the rectangular contact hole, a rectangular edge.

9. A semiconductor device, comprising:

a substrate; and an insulating film formed over said substrate, wherein said insulating film comprises a first contact having a rectangular geometry in a plan view and second to fifth contacts provided respectively adjacent to the individual edges of said rectangular first contact, formed therein, wherein said second to fifth contacts surrounding said first contact comprise a circular shape, and wherein said circular shape of said second to fifth contacts surrounding said first contact comprises, at a portion adjacent to individual edges of the first contact, a rectangular edge.

10. The semiconductor device as claimed in claim 3, further comprising hardened portions formed in a region of the resist film, the hardened portions being formed between the first contact hole and at least one of the second to fifth contact holes.

11. The semiconductor device as claimed in claim 10, wherein the hardened portions have a rectangular geometry.

* * * * *